(12) United States Patent
Vitaletti

(10) Patent No.: US 10,019,539 B2
(45) Date of Patent: Jul. 10, 2018

(54) PARTITIONING OF A NETWORK USING MULTIPLE POLES FOR EACH PART THEREOF

(71) Applicant: International Business Machines Corporation, Armonk, NY (US)

(72) Inventor: Marcello Vitaletti, Rome (IT)

(73) Assignee: International Business Machines Corporation, Armonk, NY (US)

( * ) Notice: Subject to any disclaimer, the term of this patent is extended or adjusted under 35 U.S.C. 154(b) by 632 days.

(21) Appl. No.: 14/687,623

(22) Filed: Apr. 15, 2015

(65) Prior Publication Data
US 2015/0339412 A1    Nov. 26, 2015

(30) Foreign Application Priority Data

May 20, 2014    (GB) .................................. 1408915.5

(51) Int. Cl.
*G06F 17/50*    (2006.01)
*G06F 17/10*    (2006.01)
(Continued)

(52) U.S. Cl.
CPC .......... *G06F 17/5004* (2013.01); *G06F 17/10* (2013.01); *G06F 17/509* (2013.01);
(Continued)

(58) Field of Classification Search
CPC .... G06F 17/5004; G06F 17/509; G06F 17/10; G06Q 50/06; G06Q 10/06; G06Q 10/04
USPC ............................................................ 703/1
See application file for complete search history.

(56) References Cited

U.S. PATENT DOCUMENTS

| 5,748,844 A | 5/1998 | Marks et al. |
| 8,024,051 B2 | 9/2011 | Korobkov et al. |
| 2005/0049838 A1* | 3/2005 | Danko ................... G06F 17/13 703/2 |

FOREIGN PATENT DOCUMENTS

| CN | 202440876 U | 9/2012 |
| WO | WO2012158218 A1 | 11/2012 |

OTHER PUBLICATIONS

De Paola et al., "Optimal design of district metered areas in water distribution networks," 12th International Conference on Computing and Control for the Water Industry (CCWI2013), Sep. 2013, Procedia Engineering vol. 70, pp. 449-457.

(Continued)

*Primary Examiner* — Saif A Alhija
(74) *Attorney, Agent, or Firm* — Yee & Associates, P.C.; Richard A. Wilhelm

(57) ABSTRACT

A solution is proposed for partitioning a network comprising a plurality of nodes, a distance being defined for each pair of nodes according to a pre-defined metric. A corresponding method comprises generating at least one candidate partition of the network comprising a selected number of parts. For each candidate partition said generating comprises initializing a plurality of poles for each part, each pole being initialized to one of the nodes of the network, and repeating assigning the nodes of the network each one to the part with the pole having the shortest distance from the node, and moving the poles of each part to distinct nodes of the part according to an objective function based on the distances of the other nodes of the part from the poles, until at least one convergence condition is satisfied.

12 Claims, 12 Drawing Sheets

(51) Int. Cl.
*G06Q 10/04* (2012.01)
*G06Q 10/06* (2012.01)
*G06Q 50/06* (2012.01)

(52) U.S. Cl.
CPC ............ *G06Q 10/04* (2013.01); *G06Q 10/06* (2013.01); *G06Q 50/06* (2013.01)

(56) References Cited

OTHER PUBLICATIONS

Hu et al.,m "Avoiding Store Misses to Fully Modified Cache Blocks," 25th IEEE International Performance, Computing, and Communications Conference (IPCCC 2006), Apr. 2006, pp. 289-296.
Roy et al., "A Flexible Algorithm for Sensor Network Partitioning and Self-Partitioning Problems," Algorithmic Aspects of Wireless Sensor Networks, Jul. 2006, Lecture Notes in Computer Science vol. 4240, pp. 152-163.
Ruddell et al., "Graph partitioning for network problems," Joint Conference of the NZ Statistical Association and Operations Research Society of NZ, Nov. 2013, 10 pages.
Stanton et al., "Streaming Graph Partitioning for Large Distributed Graphs," Proceedings of the 18th ACM SIGKDD International Conference on Knowledge Discovery and Data Mining, Aug. 2012, pp. 1222-1230.
Zhang et al., "Optimal Microgrid Partition Strategy of Distribution Generation Based on Advanced GA," 2010 International Conference on Intelligent System Design and Engineering Application (ISDEA), Oct. 2010, pp. 13-16.

* cited by examiner

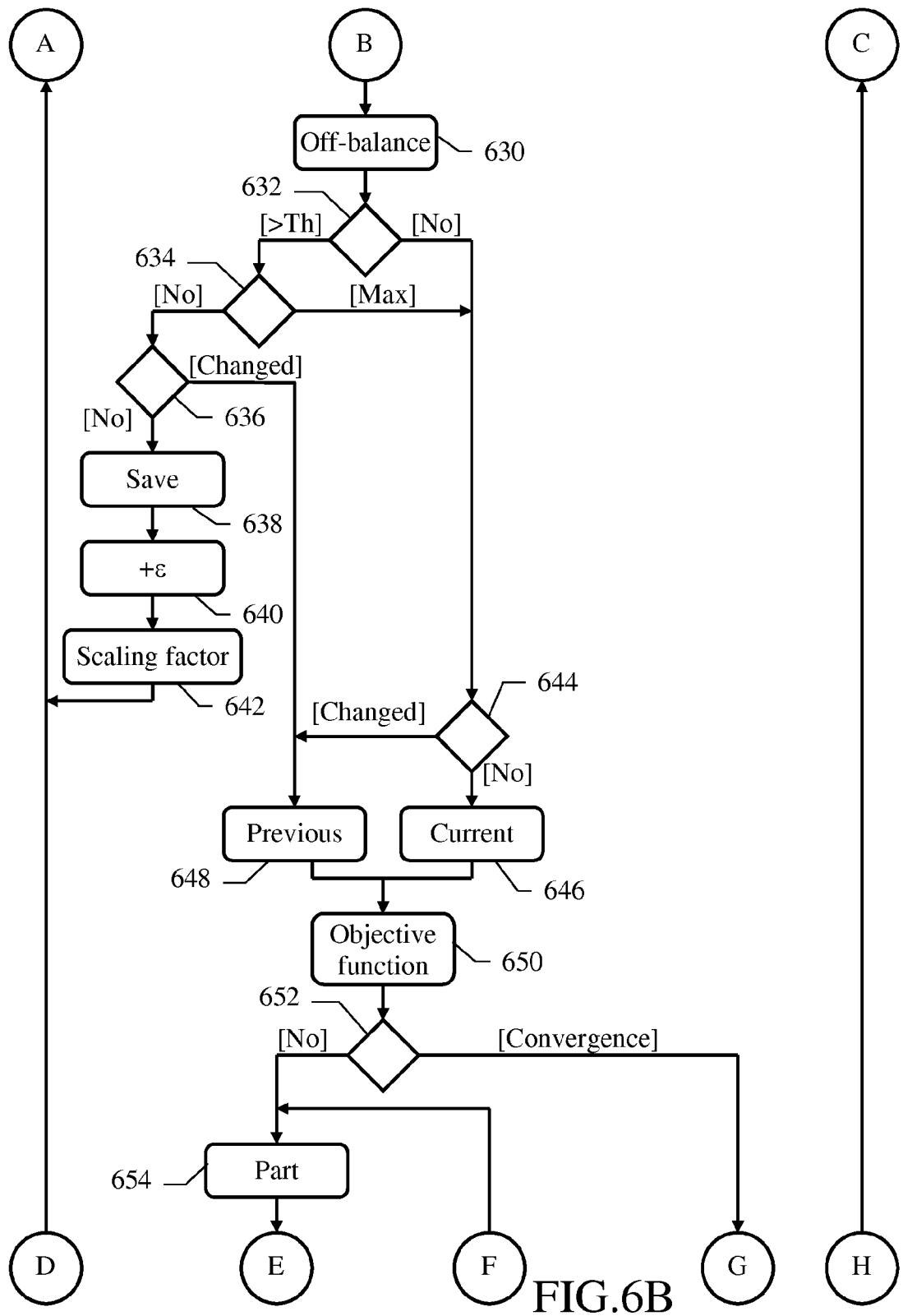

PARTITIONING OF A NETWORK USING MULTIPLE POLES FOR EACH PART THEREOF

CROSS-REFERENCE TO RELATED APPLICATION(S)

This application claims the benefit of priority to United Kingdom Patent Application No. GB1408915.5, filed May 20, 2014, the entire contents of which are incorporated herein by reference.

DESCRIPTION

Technical Field

The present disclosure relates to the data processing field. More specifically, this disclosure relates to the partitioning of networks.

Background

Networks of interconnected objects (known as nodes) are commonly used in a number of fields; typical examples are distribution networks of commodities (for example, water). The networks are often partitioned into smaller components (known as parts). For example, a large Water Distribution Network (WDN), or simply network, may be partitioned into parts known as District Metered Areas (DMAs), or simply districts. This facilitates the localization of leakages in the network by monitoring a balance between an inflow and an outflow of each district, and it allows supplying each district at lower pressure (thereby saving energy for pumping the water and reducing the leakages); particularly, users of the network may be distributed throughout the districts to limit a range of their elevation (from ground) with respect to the elevation of a corresponding source, so as to allow supplying the districts at a pressure that is only slightly higher than a Minimum Service Pressure (MSP).

For this purpose, each network may be modeled with a graph, wherein the nodes (i.e., concentrated users and sources in a water distribution network) are represented by vertices of the graph and their connections (i.e., pipes in a water distribution network) are represented by corresponding edges of the graph. Partitioning algorithms may then be used to partition the graph, and then the corresponding network. For example, a multi-level graph partitioning algorithm implements an iterative process, wherein at each iteration the (original) graph is reduced into a smaller graph by collapsing its vertices and edges, the smaller graph is partitioned and then mapped back to the original graph. A widely used software tool implementing the multi-level graph partitioning algorithm is METIS (by Karypis Lab of the Digital Technology Center (DTC) at the University of Minnesota). The partitioning algorithms allow partitioning the network into parts that fulfill load balancing constraints (aiming at leveling an aggregate weight of the nodes of the parts) and minimum cut constraints (aiming at limiting a total cost of the edges removed between the different parts). However, in this way it is not possible to ensure the fulfillment of other critical constraints that may be required in practical applications (for example, the presence of at least one source in each district for a water distribution network).

The partitioning of the network may also be based on clustering algorithms (commonly used to cluster objects into groups with similar properties, known as clusters). For example, the k-means algorithm may be applied to partition the network into a predefined number (k) of parts, each one with the corresponding nodes that are clustered around a central position thereof (known as centroid). The k-means algorithm is based on an iterative process, wherein each iteration comprises an assign (or expectation) phase and a move (or maximization) phase. Particularly, in the assign phase each node is assigned to the part of the closest centroid (initially selected randomly); thereafter, in the move phase the centroid of each part so obtained is moved to a central position thereof. The k-means algorithm converges quickly; however, the obtained partition of the network only provides a local optimum depending on the initial selection of the centroids (with no guarantee that it is a global optimum as well). Therefore, it is common to run the k-means algorithm several times (up to some thousands in large networks) with different initial centroids, and then to select the optimal one among the obtained partitions.

Particularly, a specific process for partitioning a water distribution network is described in "Optimal design of district metered areas in water distribution networks, Francesco De Paola, Nicola Fontana, Enzo Galdiero, Maurizio Giugni, Gianluca Sorgenti degli Uberti and Marcello Vialetti, 12th International Conference on Computing and Control for the Water Industry, CCWI2013" (the entire disclosure of which is herein incorporated by reference). In this case, multiple candidate partitions are generated by running a variant of the k-means algorithm; a best partition is then searched among the candidate partitions that provide a minimum cost of a hydraulically feasible implementation. This variant of the k-means algorithm requires that the centroids should coincide with nodes of the network (also known as medoids in this case). Moreover, for each pair of adjacent nodes of the network (sharing a common edge in the corresponding graph) a distance between them (assigned as a weight to this edge) is defined according to their water demands and elevations; the distance between each pair of nodes of the network (used both in the assign phase and in the move phase) is then defined by the shortest path between them that minimizes the sum of the weights of the constituent edges. In the move phase, the centroids of each part are moved to positions (defined by their nodes) that minimize an objective function based on the sum or on the maximum of the distances from them of the corresponding nodes. The same algorithm being run several times (with different initial centroids) generates different partitions that may be ranked by corresponding values of the objective function calculated for all the nodes of the network; further criteria may be introduced for discarding some of these partitions (for example, according to a maximum off-balance of the water demand of the users of the different parts).

However, the k-means algorithm generates partitions with parts that generally are in the form of compact polygonal regions (clustered around the corresponding centroids); therefore, this may exclude partitions that are more feasible for practical implementations, for example, for accessing their boundaries (such as hydraulically in water distribution networks).

Moreover, the k-means algorithm does not support any load balancing mechanism explicitly. Therefore, the generated partitions may be unfeasible for practical implementations, for example, because of too over-loaded parts (such as with a water demand of its users that may not be satisfied by the corresponding sources).

SUMMARY

A simplified summary of the present disclosure is herein presented in order to provide a basic understanding thereof;

however, the sole purpose of this summary is to introduce some concepts of the disclosure in a simplified form as a prelude to its following more detailed description, and it is not to be interpreted as an identification of its key elements nor as a delineation of its scope.

In general terms, the present disclosure is based on the idea of supporting parts with variable shape.

Particularly, an aspect provides a method for partitioning a network, wherein one or more candidate partitions are generated by assigning the nodes of the network to parts each one having multiple poles.

A further aspect provides a computer program for implementing the method (and a corresponding computer program product).

A further aspect provides a corresponding system.

More specifically, one or more aspects of the present disclosure are set out in the independent claims and advantageous features thereof are set out in the dependent claims, with the wording of all the claims that is herein incorporated verbatim by reference (with any advantageous feature provided with reference to any specific aspect that applies mutatis mutandis to every other aspect).

BRIEF DESCRIPTION OF THE DRAWINGS

The solution of the present disclosure, as well as further features and the advantages thereof, will be best understood with reference to the following detailed description thereof, given purely by way of a non-restrictive indication, to be read in conjunction with the accompanying drawings (wherein, for the sake of simplicity, corresponding elements are denoted with equal or similar references and their explanation is not repeated, and the name of each entity is generally used to denote both its type and its attributes— such as value, content and representation). Particularly:

FIG. 6A-FIG. 6C show an activity diagram describing the flow of activities relating to an implementation of the solution according to an embodiment of the present disclosure.

DETAILED DESCRIPTION

Figure 1:
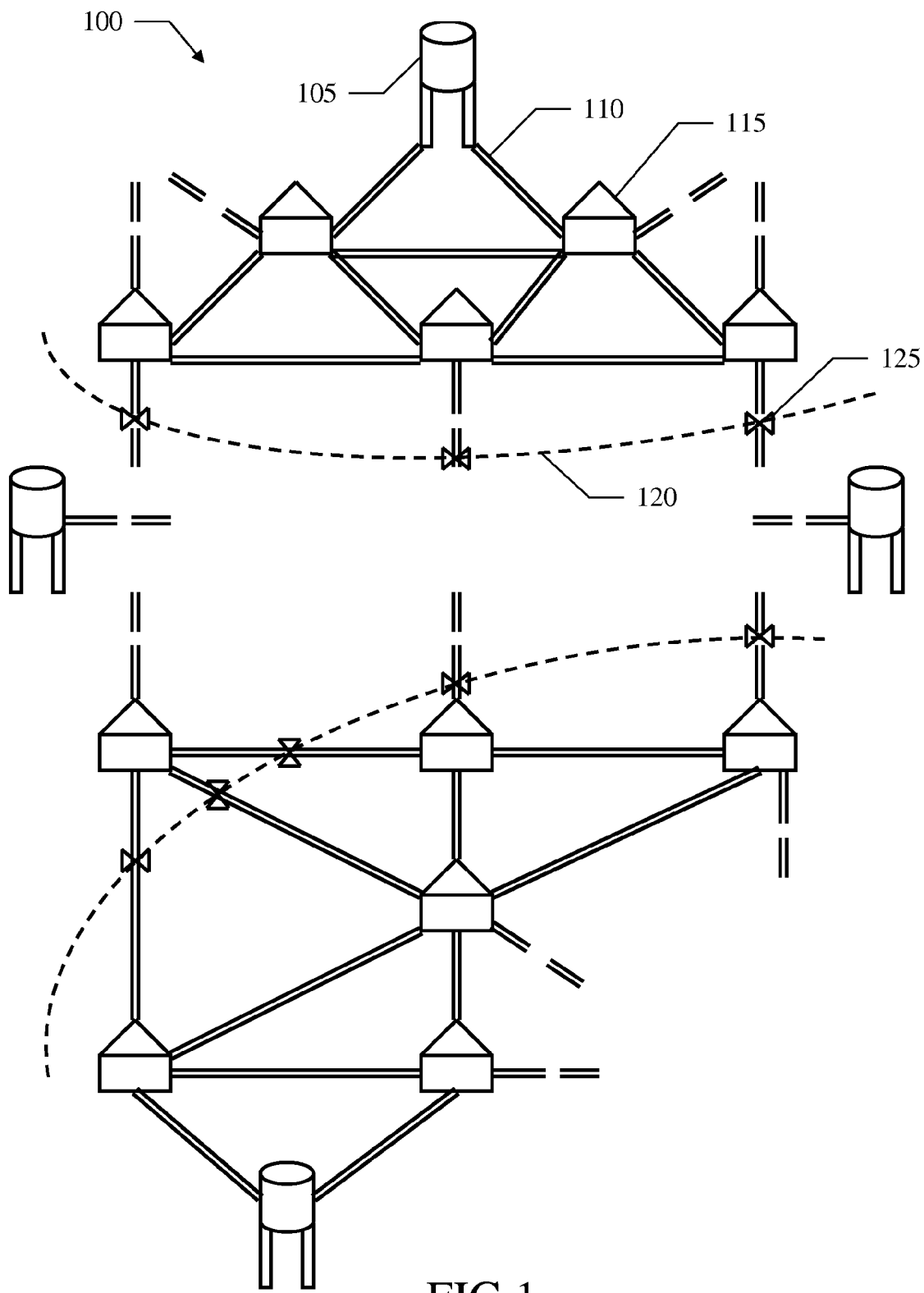
FIG. 1 shows a pictorial representation of a water distribution network to which the solution according to an embodiment of the present disclosure may be applied.

With reference in particular to the FIG. 1, a pictorial representation is shown of a water distribution network, or simply network, 100 to which the solution according to an embodiment of the present disclosure may be applied.

The network 100 is used to distribute water (for example, drinking water in urban areas). For this purpose, the network 100 comprises one or more sources 105 that collect and purify the water (for example, in reservoirs, tanks or towers). The sources 105 pressurize the water (for example, by pumps or gravity) and supply it to a pipe system 110. The pipe system 110 distributes the water to users 115 (for example, private houses). For this purpose, the pipe system 110 has a quite complex structure, generally with a mesh topology wherein the sources 105 and the users 115 are highly interconnected among them. The network 100 is partitioned into two or more parts 120 (district metered areas), each one comprising one or more users 115; the parts 120 are separated hydraulically by intercepting and/or regulating valves (or turbines) 125 arranged along the pipe system 110 at their boundaries; particularly, the intercepting valves 125 are used to cut-off corresponding connections in the pipe system 110 between different parts 120, whereas the regulating valves 125 are used to regulate a pressure of the water supplied from one part to another part.

Figure 2A:
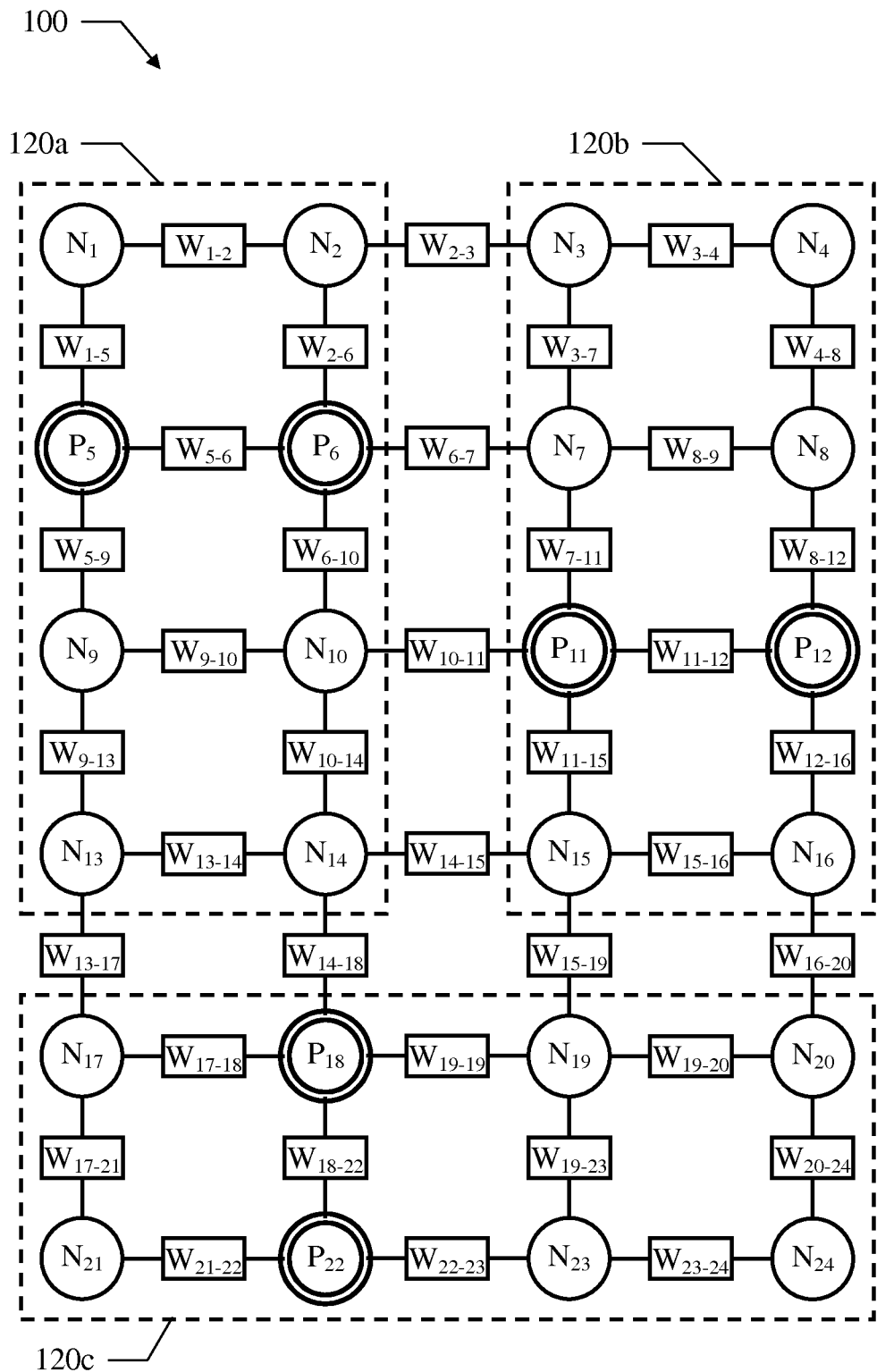
FIG. 2A-FIG. 2C show an exemplary application of the solution according to an embodiment of the present disclosure.
Figure 2B:
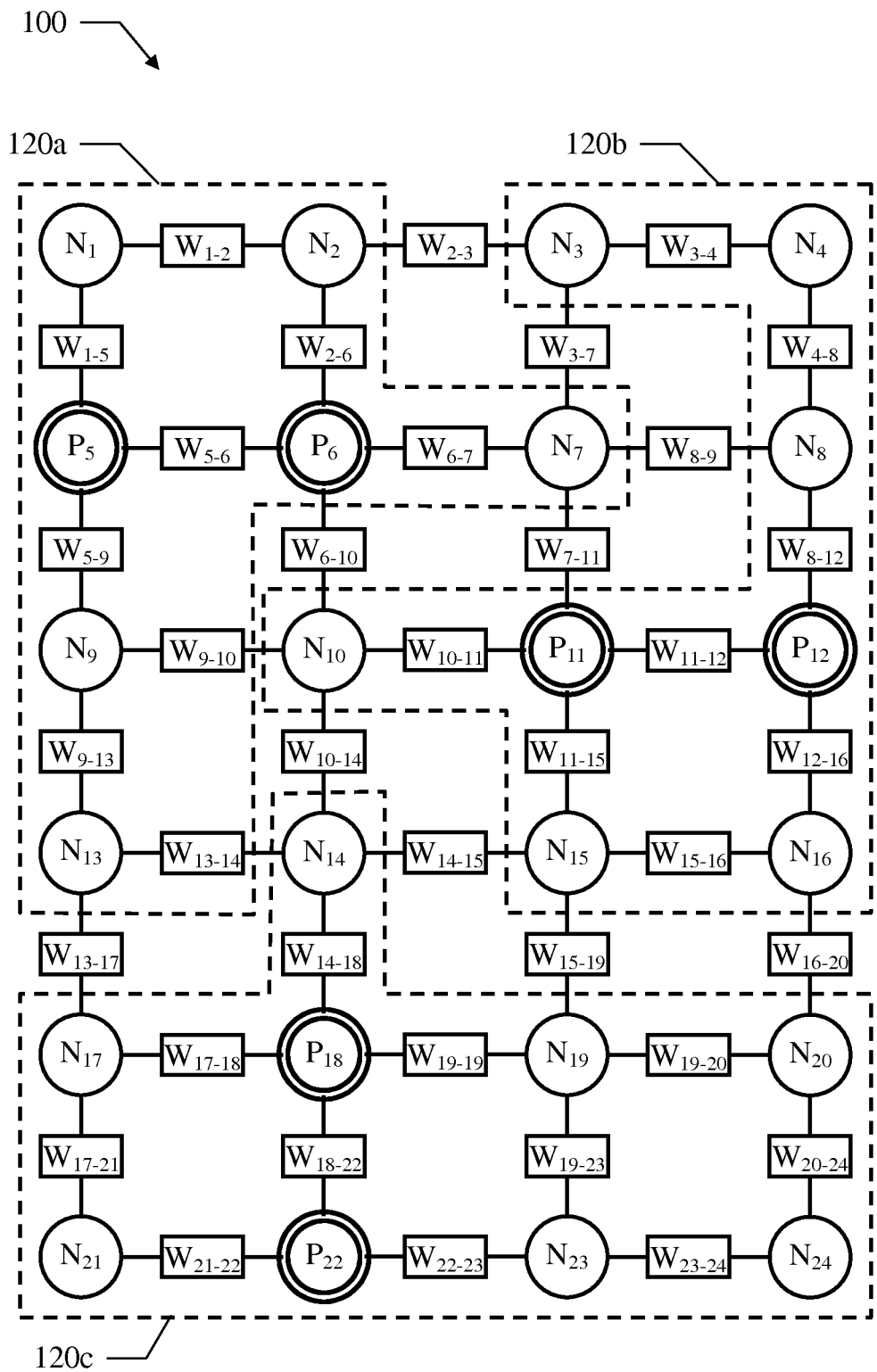
Figure 2C:
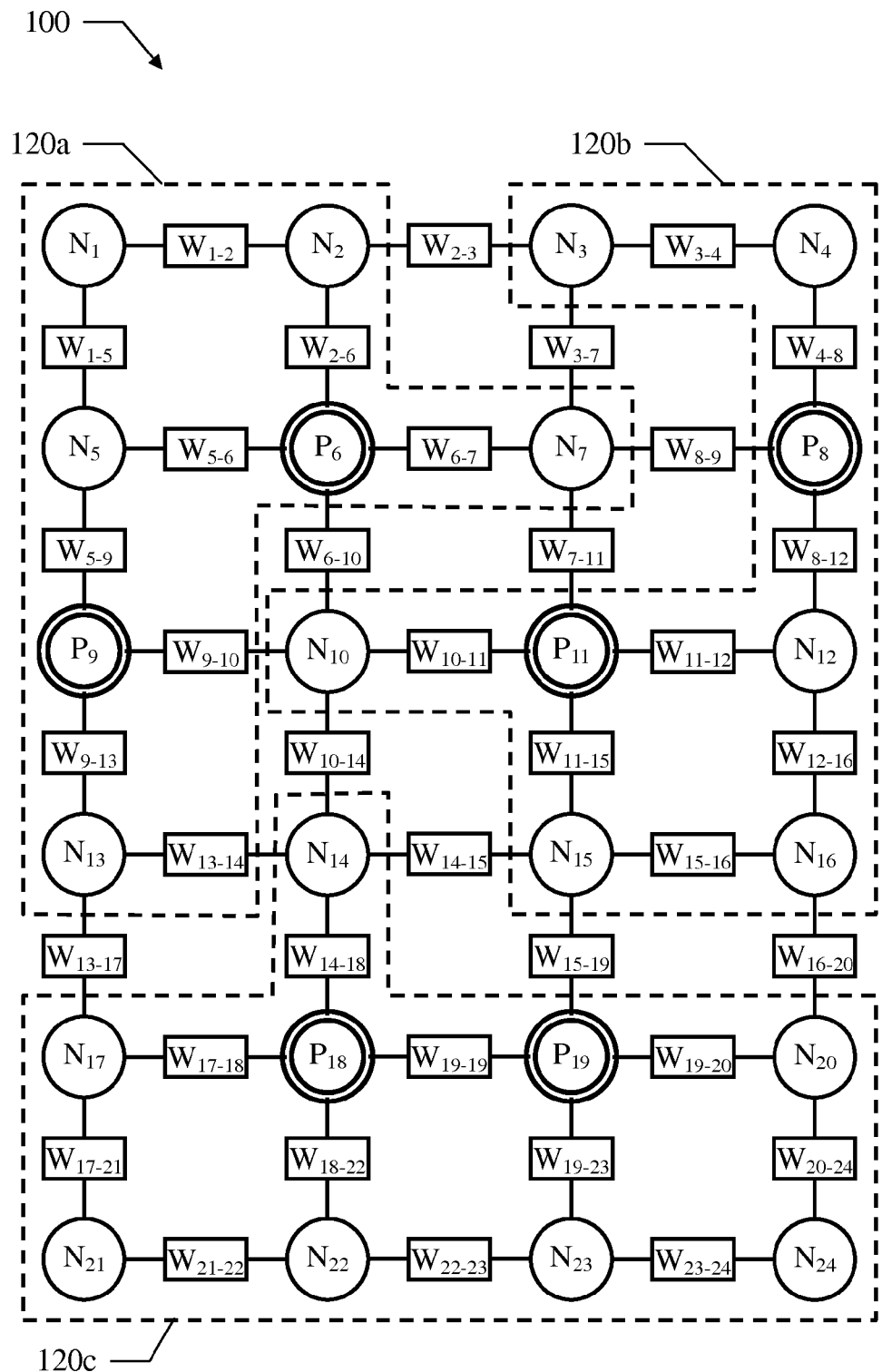

Moving to the FIG. 2A-FIG. 2C, an exemplary application is shown of the solution according to an embodiment of the present disclosure.

The network 100 is modeled with a graph. The graph represents each node consisting of a single user or a concentrated group thereof (denoted with the reference $N_k$, with k=1 . . . nofNodes where nofNodes is the number of nodes of the network 100) with a vertex. Moreover, the graph represents each pipe directly connecting a pair of adjacent nodes $N_i$ and $N_j$ (denoted with the reference $W_{ij}$) with an edge; the edge $W_{ij}$ has a weight (denoted with the same reference) that defines a distance between the nodes $N_i$ and $N_j$ according to a suitable metric (for example, based on the length of the pipe and on the elevation difference of the nodes $N_i$-$N_j$).

In the solution according to an embodiment of the present disclosure (as described in detail in the following) a new heuristic algorithm (referred to as generation algorithm) is proposed for partitioning the network 100 in a selected number of parts; this generation algorithm is derived from the general concepts of the k-means algorithm, but it differs radically in that multiple poles are used for each part (instead of a single centroid). Each pole coincides with one of the nodes $N_k$ of its part (differentiated with the reference $P_k$ and highlighted with a double border in the figures); the poles $P_k$ of each part again identify central positions thereof (with a decreasing level of accuracy). Therefore, in each part the poles $P_k$ are arranged more peripherally, closer to its boundary (and then generally to the other parts).

For example, a very simple case is considered wherein the network 100 has to be partitioned into three parts (differentiated with the references 120a, 120b and 120c); for this purpose, two poles $P_k$ are defined for each part 120a-120c. The partition of the network 100 at a generic iteration of the generation algorithm is shown in the FIG. 2A. In this case, the part 120a has a pole $P_5$ and a pole $P_6$ (close to the part 120b), the part 120b has a pole $P_{12}$ and a pole $P_{11}$ (close to the part 120a), and the part 120c has a pole $P_{22}$ and a pole $P_{18}$ (close to the part 120a).

Each iteration of the generation algorithm again comprises an assign phase and a move phase. In the assign phase, each node $N_k$ is assigned to the part 120a-120c of the closest pole $P_k$ (according to the distance of the node $N_k$ from each pole $P_k$, for example, defined by the weights of the edges $W_{ij}$ along the shortest path between them). In this case, however, the presence of poles $P_k$ of other parts 120a-120c close to the boundary of each part 120a-120c may bias its nodes $N_k$ towards them. For example, the node $N_7$ (of the part 120b) may be closer to the pole $P_6$ (of the part 120a), the node $N_{10}$ (of the part 120a) may be closer to the pole $N_{11}$ (of the part 120b), and the node $N_{14}$ (of the part 120a) may be closer to the pole $P_{18}$ (of the part 120c).

As a consequence, as shown in the FIG. 2B, now the node $N_7$ is assigned to the part 120a (from the part 120b), the node $N_{10}$ is assigned to the part 120b (from the part 120a), and the node $N_{14}$ is assigned to the part 120c (from the part 120a).

Thereafter, in the move phase the poles $P_k$ of each part 120a-120c so obtained are moved to central positions thereof (again with a decreasing level of accuracy); the (new) positions of the poles $P_k$ are selected, among the possible combinations defined by the nodes $N_k$ of the part 120a-120c.

For example, as shown in the FIG. 2C, now the part 120a has the poles $P_6$ and $P_9$, the part 120b has the poles $P_8$ and $P_{11}$, and the part 120c has the poles $P_{18}$ and $P_{19}$.

In this way, the parts no longer cluster only around the corresponding central positions. As a consequence, the parts may now have any size and shape (and particularly, branched shapes as well), with the higher the number of poles the more complex the obtained shapes. This allows taking into account partitions that may be more feasible for practical implementations, for example, for accessing their boundaries (such as hydraulically in water distribution networks).

Figure 3A:
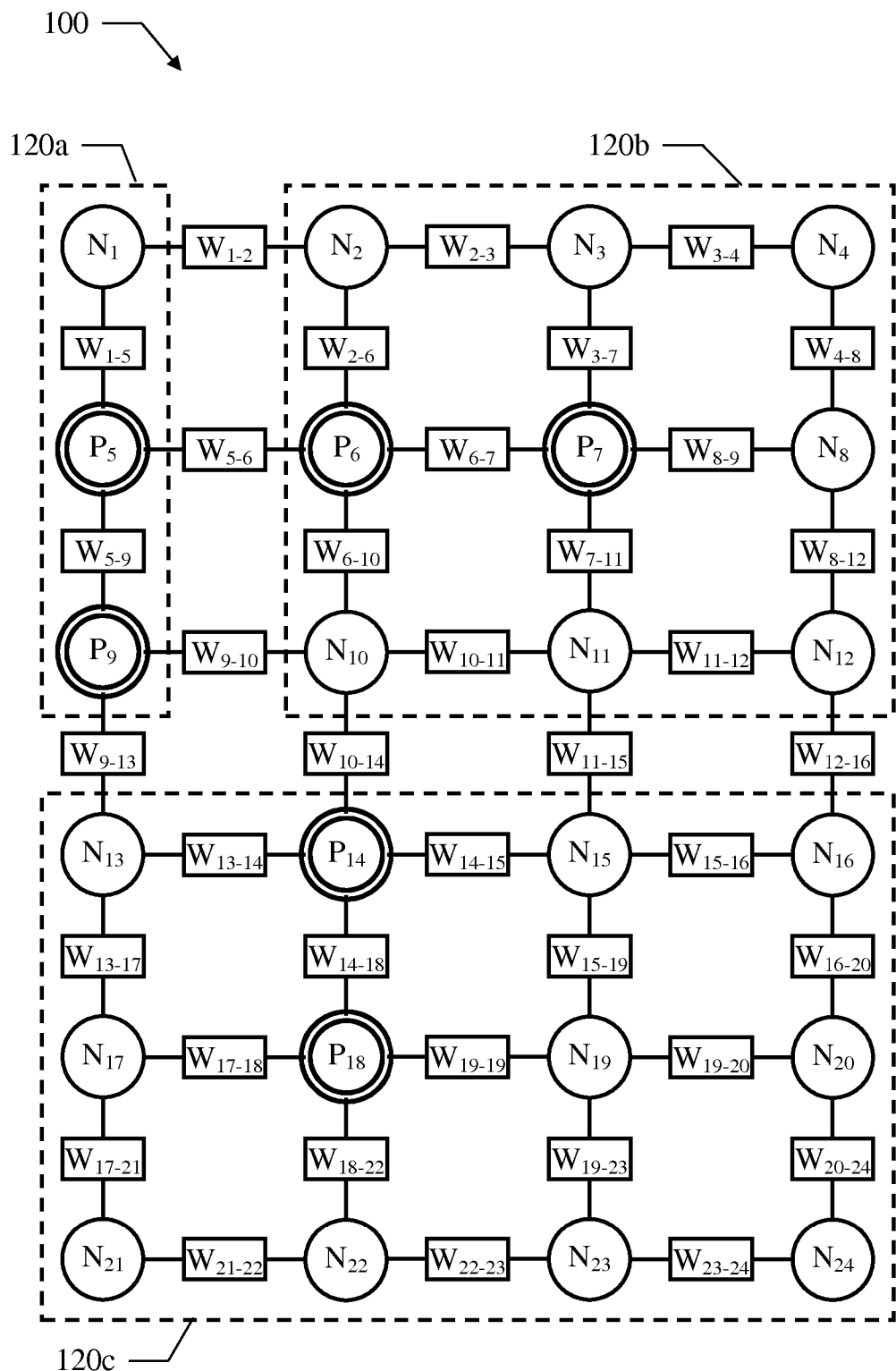
FIG. 3A-FIG. 3C show an exemplary application of the solution according to a further embodiment of the present disclosure.
Figure 3B:
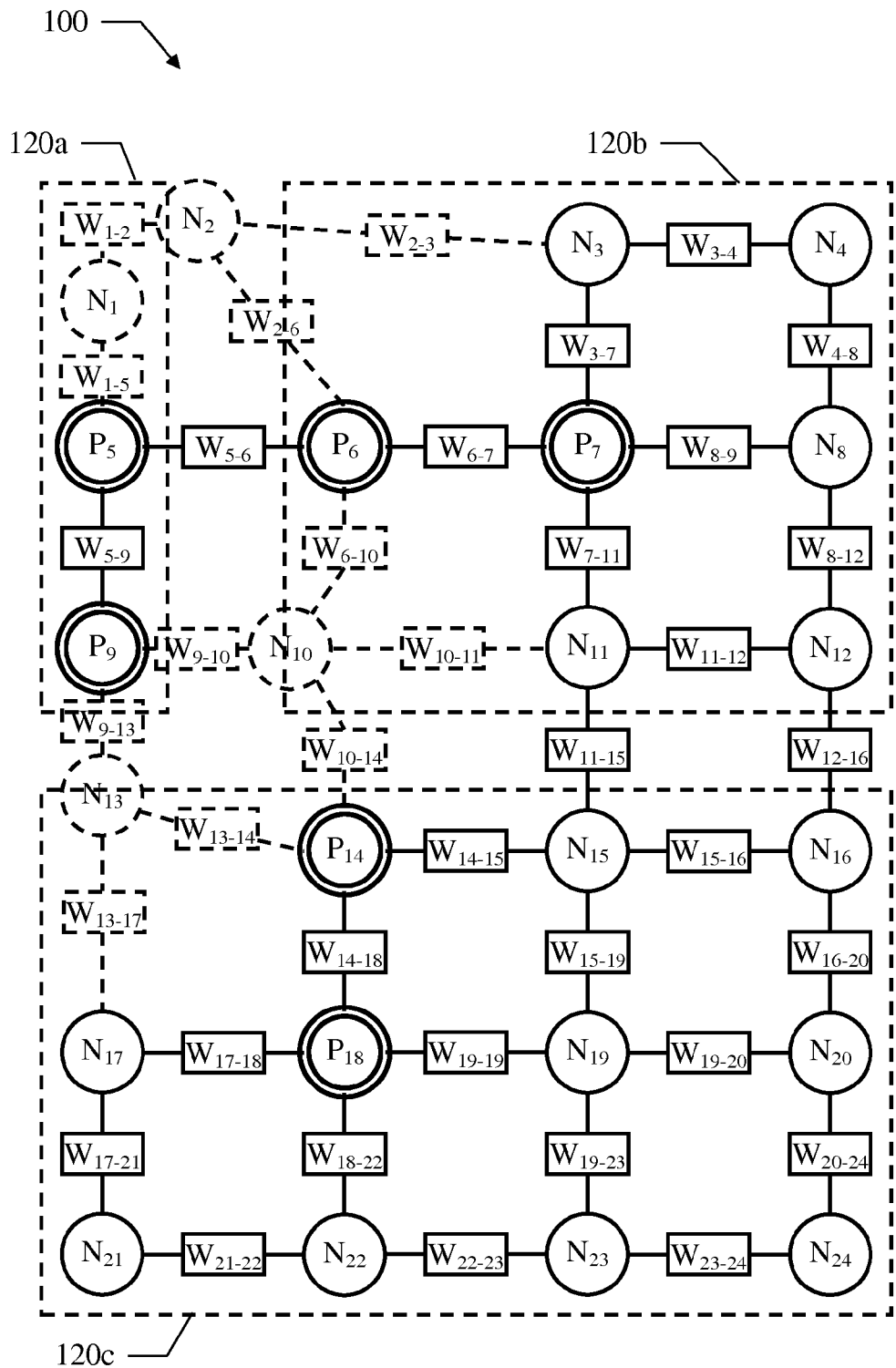

Moving to the FIG. 3A-FIG. 3B, an exemplary application is shown of the solution according to a further embodiment of the present disclosure.

In this case, in addition (or in alternative) to the above-mentioned multiple poles, the generation algorithm also supports a load balancing mechanism. For this purpose, as described in detail in the following, in the assign phase the distance of each node $N_k$ from each pole $P_k$ is now scaled according to a corresponding scaling factor. The scaling factor depends (at least in part) on the load of the parts 120a-120c (for example, defined by a total water demand of their nodes $N_k$); more specifically, the scaling factor increasingly correlates the (scaled) distance from each pole $P_k$ to the load of the corresponding part 120a-120c (with the lower the load the lower the distance and the higher the load the higher the distance). In this way, for each node $N_k$ its distance from the poles $P_k$ of the less loaded parts 120a-102c decreases and the distance from the poles of the more loaded parts 120a-102c increases; as a result, during the assign phase this generates a sort of attraction from the less loaded parts 120a-102c and a sort of repulsion from the more loaded parts 120a-102c.

For example, as shown in the FIG. 3A, the poles $P_5$ and $P_9$ of the part 120a are close to a boundary of the network 100 and also close to one or more poles $P_k$ of the other parts 120b-120c (i.e., the pole $P_6$ of the part 120b and the pole $P_{14}$ of the part 120c); in this case, most of the nodes $N_k$ are closer to the poles $P_6,P_{14})_{14}$ (of the parts 120b and 120c) than they are to the poles $P_5,P_9$ (of the part 120a). As a result, only a few nodes $N_k$ may be assigned to the part 120a (which is then generally under-loaded), whereas most of the nodes $N_k$ may be assigned to the parts 120b-120c (which are then generally over-loaded).

However, as shown in the FIG. 3B, in the assign phase of a next iteration of the generation algorithm, for each node $N_k$ its distance from the poles $P_5,P_9$ of the (under-loaded) part 120a decreases and its distance from the poles $P_6,P_7$-$P_{14},P_{18}$ of the (over-loaded) parts 120b-120c increases. For example, as shown in dashed lines in the figure, the node $N_2$ becomes closer to the pole $P_5$ of the part 120a (with respect to the pole $P_6$ of the part 120b), the node $N_{10}$ becomes closer to the pole $P_9$ of the part 120a (with respect to the poles $P_6$-$P_{14}$ of the parts 120b-120c), and the node $N_{13}$ moves closer to the pole $P_9$ of the part 120a (with respect to the pole $P_{14}$ of the part 120c).

Figure 3C:
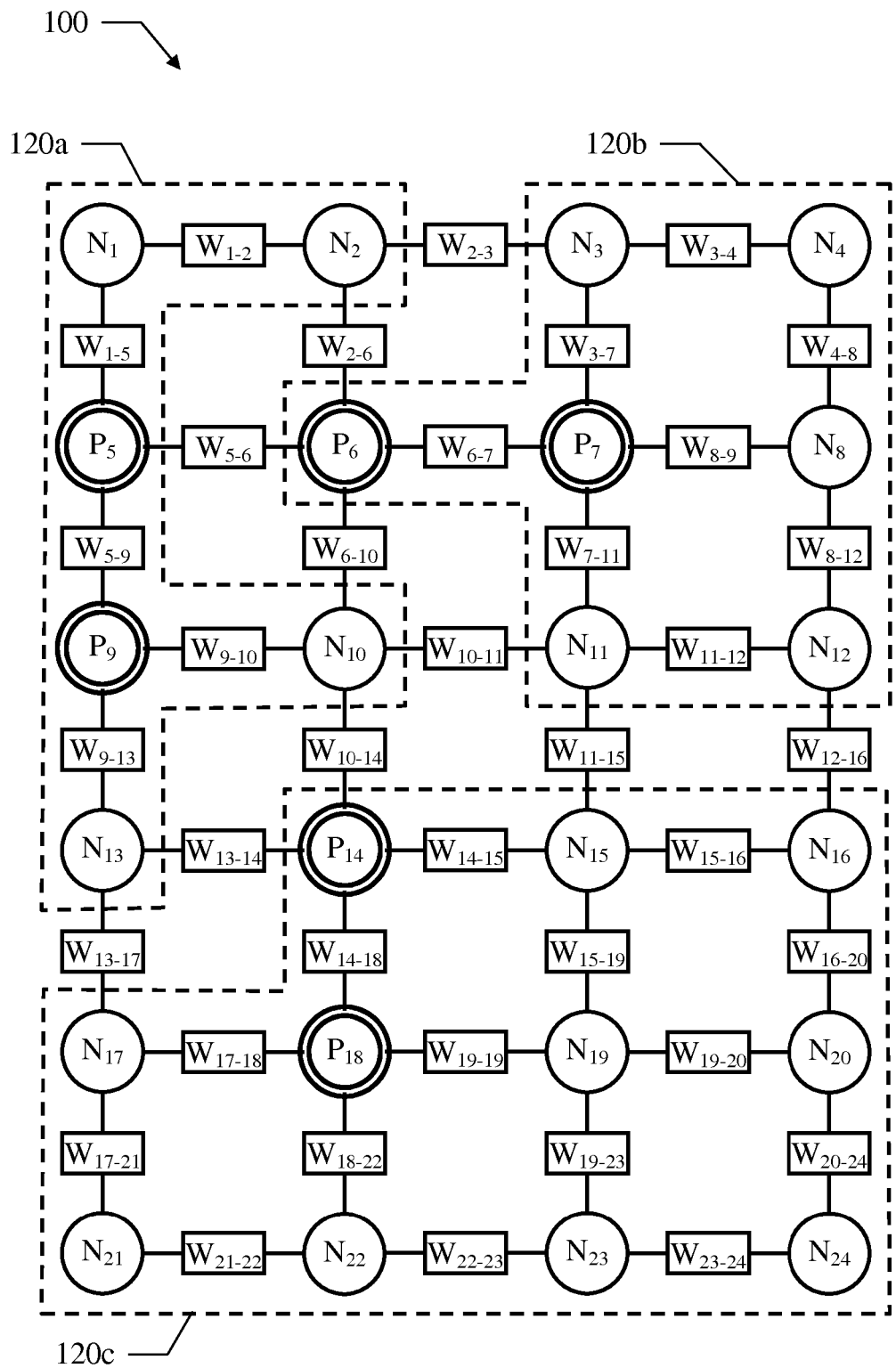

As a consequence, as shown in the FIG. 3C, now the nodes $N_2,N_{10}$ (from the part 120b) and the node $N_{13}$ (from the part 120c) are assigned to the part 120a; this increases the number of nodes $N_k$ and then the load of the (under-loaded) part 120a, at the same time reducing the number of nodes $N_k$ and then the load of the (over-loaded) parts 120b-120c.

In this way, a load balancing mechanism is explicitly introduced in the generation algorithm. This avoids (or at least substantially reduces) the risk of generating partitions that may be unfeasible for practical implementations, for example, because of too over-loaded parts (such as with a water demand of its users that may not be satisfied by the corresponding sources).

Figure 4:
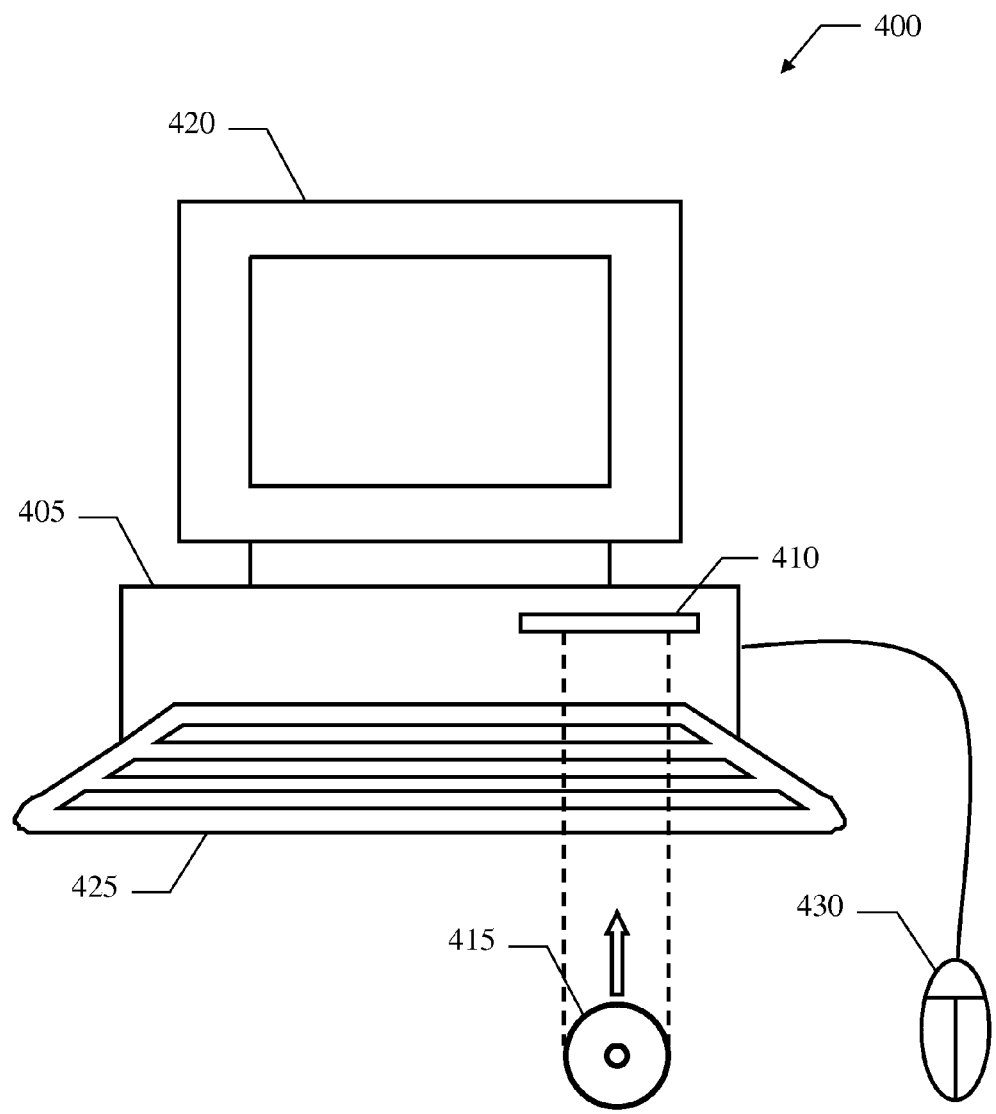
FIG. 4 shows a schematic block-diagram of a computing system that may be used to practice the solution according to an embodiment of the present disclosure.

Moving to the FIG. 4, a schematic block-diagram is shown of a computing system 400 that may be used to practice the solution according to an embodiment of the present disclosure.

The computing system, or simply computer 400 (for example, a PC), comprises a central unit 405 that houses the electronic circuits controlling its operation; typically, these electronic circuits comprise a microprocessor, a working memory, drives for any input/output units, a wireless network adapter (for example, of the Wi-Fi type) for accessing a communication network, and the like. The computer 400 is also provided with a hard-disk and a drive 410 for reading optical disks 415 (for example, CDs or DVDs). A monitor 420 is used to display images on a screen thereof. Operation of the computer 400 is controlled by means of a keyboard 425 and a mouse 430, which are connected to the central unit 405 in a conventional manner.

Figure 5:
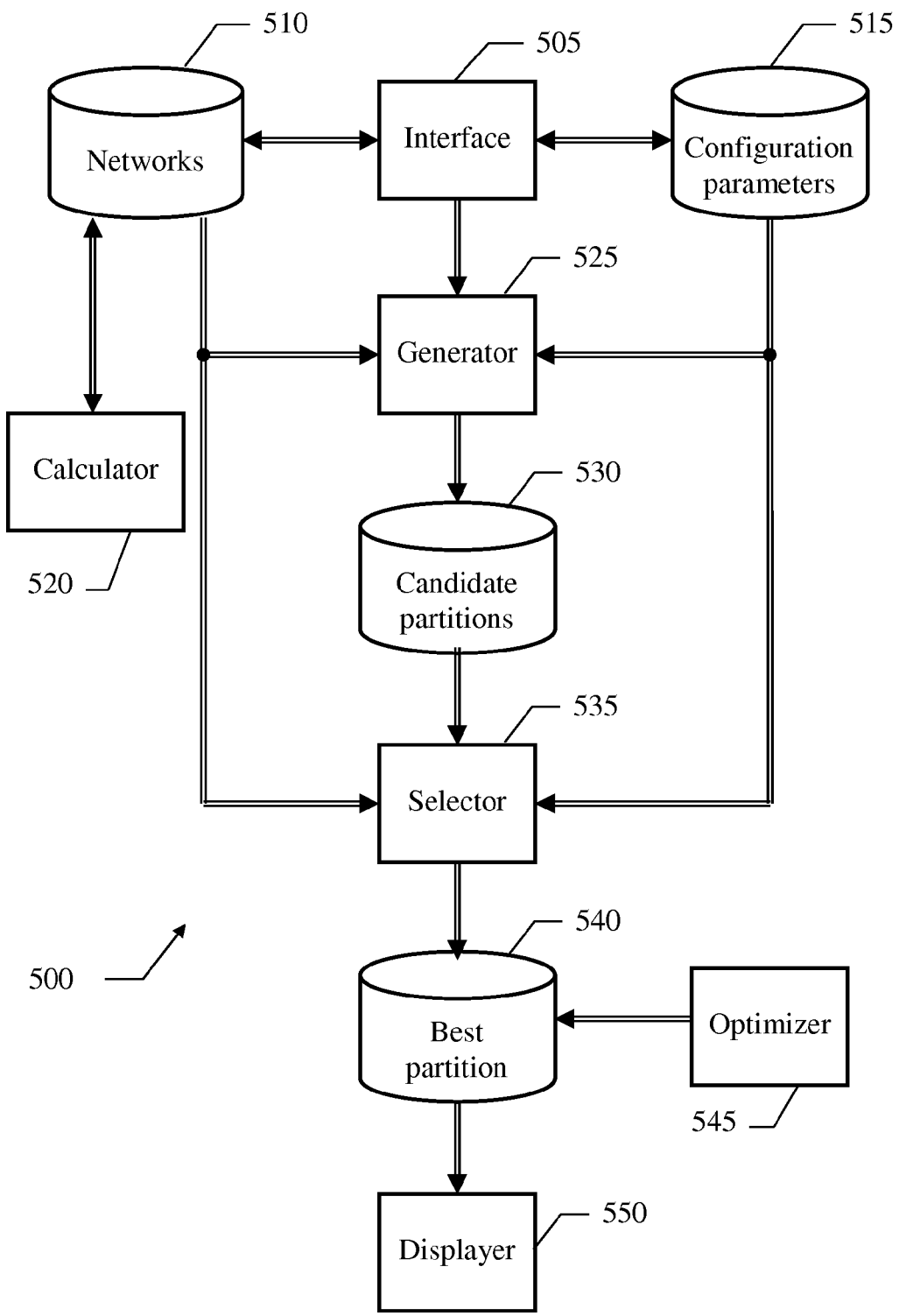
FIG. 5 shows the main software components that may be used to implement the solution according to an embodiment of the present disclosure.

Moving to the FIG. 5, the main software components are shown that may be used to implement the solution according to an embodiment of the present disclosure.

Particularly, all the software components (programs and data) are typically stored in the mass memory and loaded (at least partially) into the working memory of the above-mentioned computer when the programs are running. The programs are initially installed into its mass memory, for example, from removable storage units or from the communication network. In this respect, each software component may represent a module, segment or portion of code, which comprises one or more executable instructions for implementing the specified logical function.

The computer runs a partitioner 500, which is used to partition generic networks (and especially water distribution networks). As described in detail in the following, the partitioner 500 implements a three-step partitioning process for each selected network, wherein in a first (generation) step multiple candidate partitions are generated by the above-mentioned generation algorithm, in a second (selection) step a best partition is selected among the candidate partitions, and in a third (optimization) step a setting of the best partition is optimized.

For this purpose, an interface 505 is used by an operator to enter information and/or commands. Particularly, the interface 505 manages a network repository 510 storing a representing of each network to be partitioned. The network is defined by the corresponding graph with its sources and users (nodes) and pipes (edges), and by corresponding attributes; for example, each source is qualified by the value of its maximum water supply capability and output pressure, each user is qualified by its (average or maximum) water demand and elevation (from ground), and each pipe is qualified by its length (for example, projected on a horizontal plane) and maximum water flow. Moreover, the interface 505 manages a configuration parameter repository 515 storing the values of several configuration parameters controlling the partitioning of the networks (either individually or globally); for example, the configuration parameters comprise a number of the candidate partitions to be generated, a number of parts of each candidate partition, and a maximum (load) off-balance that is acceptable among the parts of each candidate partition. A calculator 520 accesses the network repository 510 for calculating the distance between each pair of adjacent nodes of any network; the calculator 520 adds this information to the definition of the network in the network repository 510.

The interface 505 controls a generator 525, which implements the generation step of the partitioning process (for generating all the candidate partitions of the selected network); for this purpose, the generator 525 accesses the network repository 510 and the configuration parameter repository 515. The generator 525 saves a definition of each candidate partition of the network (as defined by the nodes of each part thereof) into a candidate partition repository 530.

A selector 535 accesses the configuration parameter repository 515, the network repository 520 and the candidate partition repository 530. The selector 535 implements the selection step of the partitioning process (for selecting the best partition among the candidate partitions and for defining its configuration, for example, in terms of the required intercepting and regulating valves). The selector 535 saves the definition of the best partition into a best partition repository 540.

An optimizer 545 accesses the best partition repository 540. The optimizer 545 implements the optimization step of the partitioning process (for optimizing a setting of the best partition, for example, with reference to its regulating valves). The optimizer 545 adds the obtained setting of the best partition to its definition in the best partition repository 540.

A displayer 550 accesses the best partition repository 540 for outputting a corresponding (graphical and/or tabular) representation of the best partition of the network (for example, by displaying it on the monitor of the computer).

Figure 6A:
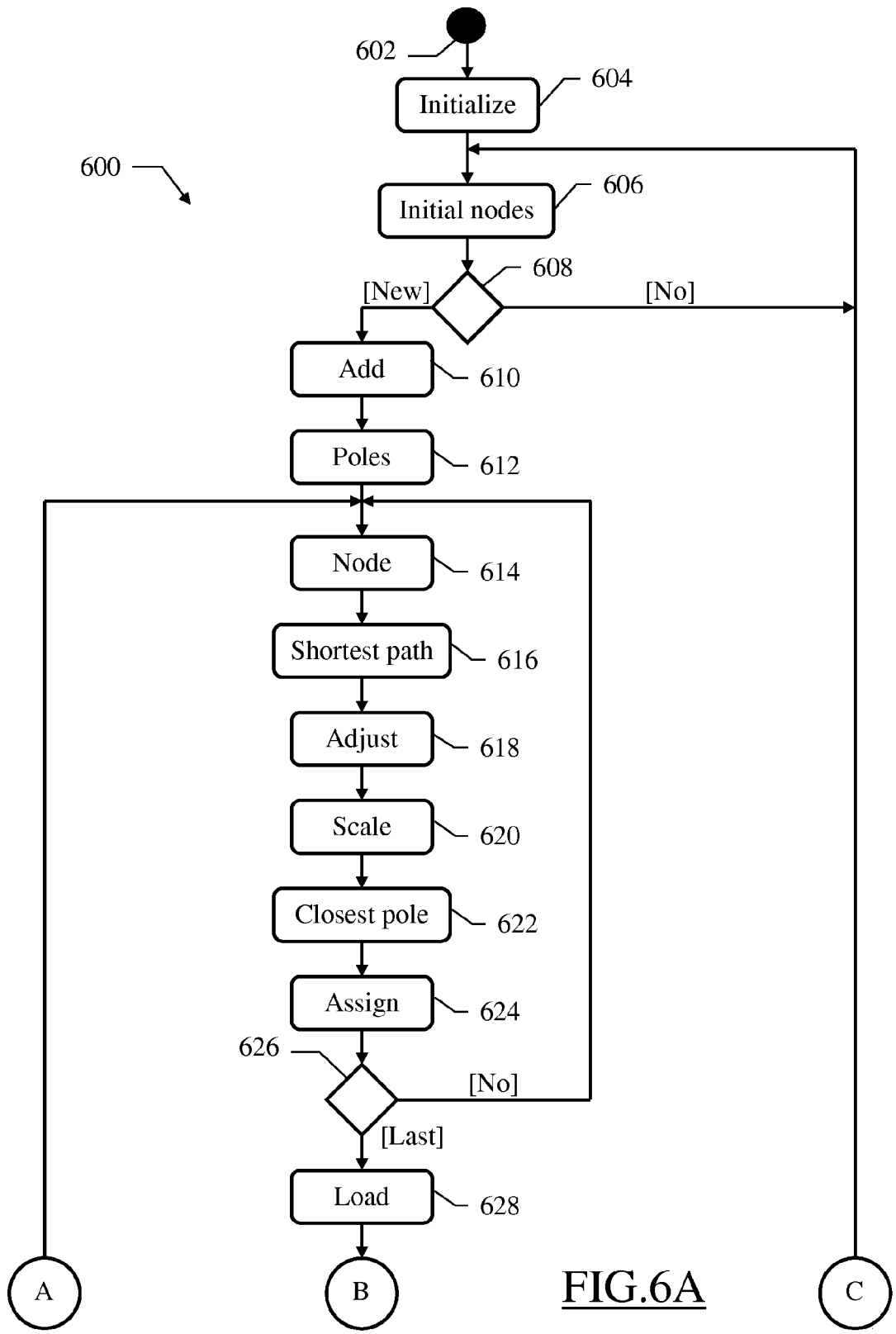
Figure 6C:
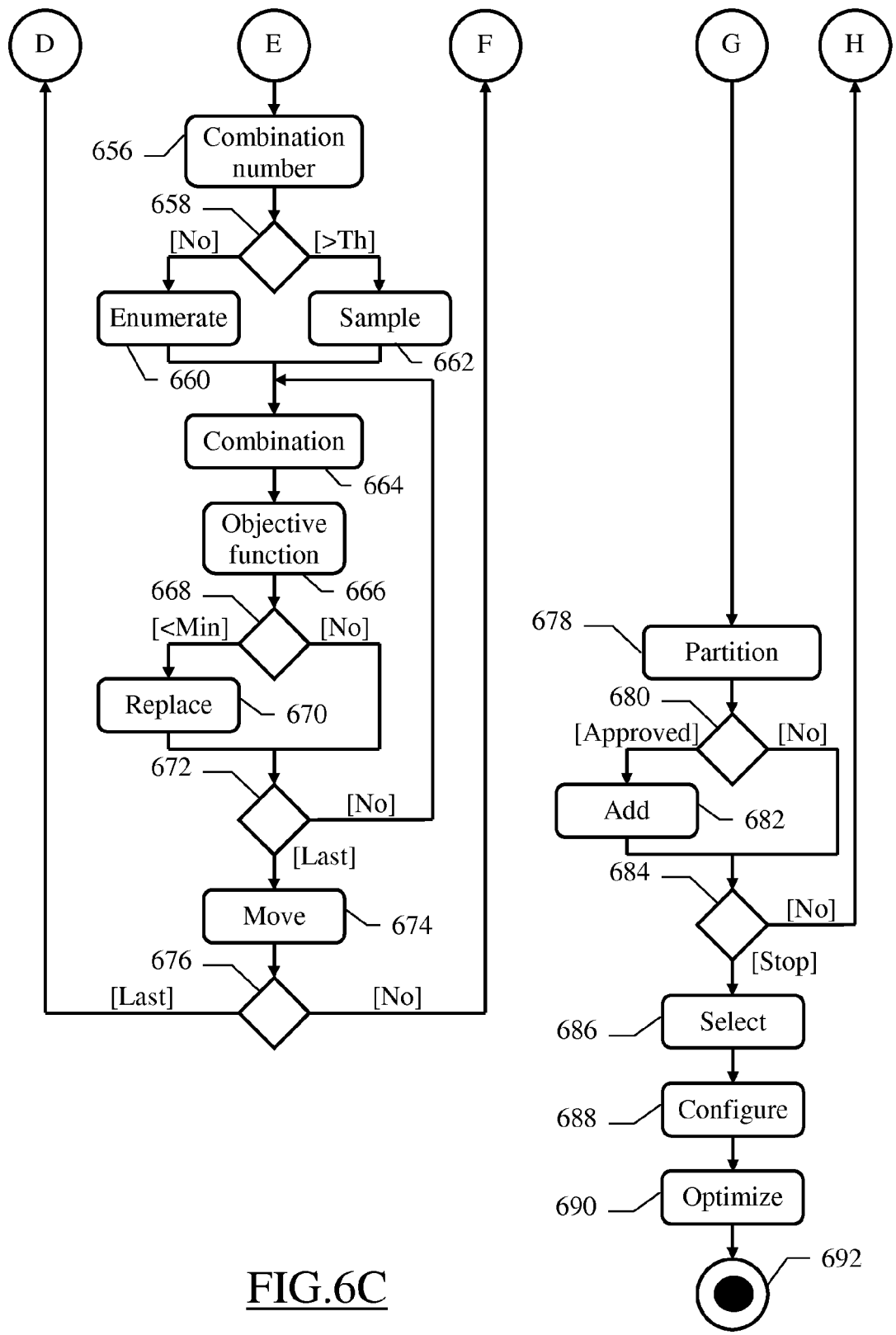

Moving to the FIG. 6A-FIG. 6C, an activity diagram is shown describing the flow of activities relating to an implementation of the solution according to an embodiment of the present disclosure.

Particularly, the diagram represents an exemplary partitioning process of a generic network with a method 600. In this respect, each block may represent one or more executable instructions for implementing the specified logical function on the above-mentioned computer.

The partitioning process begins at the black start 602 and then passes to block 604 wherein the configuration parameters relevant to the partitioning of the network are initialized (for example, by extracting them from the corresponding repository and/or by entering them manually). In this phase, the distance between each pair of adjacent nodes of the network is also calculated if it has not been done before (for example, during a previous partitioning process of the same network). The distance is based on a length term depending on the pipe length of the corresponding pipe and on an elevation term depending on the elevation difference of the nodes; for example, the length term and the elevation terms are additive terms, with the length term proportional to a dimensionless value depending on the pipe length and the elevation term proportional to a dimensionless value depending on the absolute value (to remain in the context of non-oriented graphs) of the elevation difference. Particularly, the distance $W_{ij}$ between the nodes $N_i$ and $N_j$ may be calculated by:

$$W_{ij} = \alpha \cdot \frac{D_{ij}}{avg(D)} + (1-\alpha) \cdot \frac{|E_i - E_j|}{avg(E)},$$

wherein $D_{ij}$ is the pipe length between the nodes $N_i$ and $N_j$, $E_i$ and $E_j$ are the elevations of the nodes $N_i$ and $N_j$, respectively, $avg(D_{ij})$ is the average of the pipe lengths and $avg(E_{ij})$ is the average of the elevation differences in the network $$\left(\text{i.e., } avg(D) = \frac{\sum_{i,j=1}^{nofNodes} D_{ij}}{nofEdges} \text{ and } avg(E) = \frac{\sum_{i,j=1}^{nofNodes} E_{ij}}{nofEdges}\right)$$

for each pair of adjacent nodes $N_i$ and $N_j$ in the number nofEdges, equal to the number of edges of the graph representing the network), and $\alpha$ is a weighting factor of the two terms (with $0<\alpha<1$, for example, $\alpha=\frac{1}{2}$).

The method then implements the generation step of the partitioning process (for generating the desired number of candidate partitions of the network each one by a corresponding iteration of the above-mentioned generation algorithm). For this purpose, at block 606 a set of (initial) nodes equal to the desired number of parts (of each candidate partition) is selected randomly. A test is made at block 608 to verify whether the initial nodes are new, i.e., they have not been already processed in a previous iteration of the generation algorithm, as indicated in a corresponding list (initially empty). If not, meaning that the processing of these initial nodes is useless (since it would lead to a result that has already been obtained) the flow of activity returns to the block 606 for selecting a further set of initial nodes. Conversely, if the initial nodes have not been processed yet, they are added to the corresponding list at block 610 (so as to avoid their further processing in any next iteration of the generation algorithm). Continuing to block 612, for each initial node all the poles of a corresponding part are initialized to the same position of this initial node.

The method then implements the assign phase of the generation algorithm (for assigning each node to the part of the closest pole). For this purpose, a loop is entered at block 614 wherein a (current) node is processed (starting from a first one in any arbitrary order). The distances of the node from all the poles of the network are calculated at block 616, if it has not been done before (for example, during a previous iteration of the generation algorithm or during a previous partitioning process of the same network); particularly, the distance of the node from each pole is calculated as the shortest path between them that minimizes the sum of the distances between the corresponding pairs of adjacent nodes (for example, by the Floyd-Warshall algorithm). Continuing to block 618, in the solution according to an embodiment of the present disclosure each distance is adjusted according to the elevation difference between the node and the pole (irrespectively of the elevations of any other nodes interposed between them along the corresponding shortest path); for example, the distance is adjusted by adding an adjustment term proportional to a dimensionless value depending on the absolute value (again to remain in the context of non-oriented graphs) between the node and the pole. Particularly, the distance between the node $N_i$ and the pole $P_j$ (again denoted with $W_{ij}$) may be adjusted by:

$$W_{ij} = W_{ij} + \beta \cdot \frac{|E_i - E_j|}{avg(E)},$$

wherein $\beta$ is a weighing factor modulating this adjustment (for example, $\beta=5$-$15$, such as $\beta=10$). Each distance is then scaled at block 620 according to a scaling factor of the part of the pole (as described in the following); for example, the distance may be scaled by multiplying it by the scaling factor:

$$W_{ij} = S_h \cdot W_{ij},$$

wherein $S_h$ is the scaling factor of the part $Part_h$ (with $h=1 \ldots$ nofParts where nofParts is the desired number of parts). At the beginning of each iteration of the generation algorithm, all the scaling factors are initialized to a neutral value (i.e., $S_h=1$ in the example at issue) that leaves the distances unchanged. The pole that is closest to the node according to their (adjusted and possibly scaled) distance is selected at block 622. Continuing to block 624, the node is assigned to the part of this closest pole.

In this way, the generation algorithm tends to put nodes in the same part when the corresponding pipes run substantially horizontally, thanks to the elevation term (depending on the elevation difference) that contributes to define the distance between any pair of adjacent nodes from each node to the poles. At the same time, the generation algorithm limits the risk of having nodes (with similar elevation) in the same part when they are far away, thanks to the length term (depending on the pipe length) that contributes to define the distance between any pair of adjacent nodes from each node to the poles. Moreover, the generation algorithm limits the risk of having nodes with similar elevation (and close one to another) in different parts, thanks to the adjustment term that contributes to define the distances from each node to the poles. Indeed, the elevation term of any pair of adjacent nodes from each node to each pole increases their distance independently of a sign of the corresponding elevation difference (because of the use of its absolute value); therefore, any intermediate nodes between the node and the pole that are at different elevations (both higher and lower) than the node and the pole increases their distance. The adjustment term instead mitigates this effect, since its contribution to the distance from the node to the pole is low when they have similar elevations, thereby counter-balancing the high contribution to the same distance that might be caused by any intermediate nodes oscillating around their similar elevations (i.e., alternatively up and down). All of the above allows reducing the supply pressure in each part, and then the energy required for pumping the water and the corresponding leakages.

A test is then made at block 626 to verify whether all the nodes of the network have been processed. If not, the flow of activity returns to the block 614 to process a next node of the network. As soon as all the nodes of the network have been processed, the flow of activity descends from the block 626 into block 628. At this point, the loads of the parts of the (current) partition so obtained are calculated; for example, the load of each part is based on the (average or maximum) water demands of its nodes. Particularly, the load of each part $Part_h$ (denoted with $Load_h$) may be calculated by:

$$Load_h = \sum_{k=1}^{nofNodes} Water_k,$$

wherein $Water_k$ is the water demand of the node $N_k$, $\forall N_k \in Part_h$. Continuing to block 630, a (global) load off-balance, or simply global off-balance, of the current partition is calculated; for example, the global off-balance is a dimensionless value depending on the loads of the parts. Particularly, the global off-balance (denoted with offBal) may be calculated by:

$$offBal = \frac{\max(Load) - \min(Load)}{avg(Load)},$$

wherein max(Load) is the maximum load (of the most loaded part), min(Load) is the minimum load (of the least loaded part) and avg(Load) is the average of the loads $$\left(\text{i.e., } avg(Load) = \frac{\sum_{h=1}^{nofParts} Load_h}{nofParts}\right).$$

The global off-balance is compared at block 632 with an off-balance threshold defining a maximum value thereof that is acceptable (for example, 10-50%, such as 30%).

If the global off-balance is (possibly strictly) higher than the off-balance threshold, in the solution according to an embodiment of the present disclosure the process then implements a correction thereof. For this purpose, the nodes are re-distributed among the parts so as to reduce the global off-balance as much as possible but at the same time perturbing the current partition as little as possible. Particularly, in the specific implementation described in the following the nodes are moved to the least loaded part so as to increase its load, but maintaining this part the least loaded one. This reduces the risk of introducing instabilities in the generation algorithm, and particularly the generation of parts with disconnected nodes (i.e., one or more nodes of a part that are not connected to the other nodes of the part since they are completely surrounded by the other parts), which might be caused by an excessive perturbation providing a substantial load balancing among the parts.

More specifically, the flow of activity descends from the block 632 into block 634, wherein a scaling weight (denoted with Ws) is verified; the scaling weight modulates the scaling of the distance of each node from each pole (for example, from no scaling when Ws=0 to a maximum scaling when Ws=1). For this purpose, the scaling weight is compared with its value providing the maximum scaling minus a predefined increment pitch, denoted with $\varepsilon$ (for example, $\varepsilon=e^{-4}$-$e^{-6}$, such as $\varepsilon=e^{-5}$); if the scaling weight is lower than or equal to this value, i.e., Ws$\leq 1-\varepsilon$ (always true at the beginning of each iteration of the generation algorithm when the scaling weight is initialized to 0), a further test is made at block 636 to verify whether the least loaded part of the current partition is the same as the one of a previous iteration of the assign phase (in the same iteration of the generation algorithm), as indicated in a dedicated variable. If so (and always at the beginning of each iteration of the generation algorithm), the process continues to block 638, wherein a definition of the current partition and an indication of its least loaded part are saved into a dedicated variable. The scaling weight is then increased at block 640 by the increment pitch (i.e., Ws=Ws+ε), so as to increase the scaling of the distances for a next iteration of the assign phase. Moving to the block 642, the scaling factor of each part is calculated according to its load (and to the scaling weight). For example, a (local) load off-balance, or simply local off-balance, of each part is defined by a dimensionless value depending on its load. Particularly, the local off-balance of each part $Part_h$ (denoted with $offBal_h$) may be calculated by:

$$OffBal_h = \left(1 - \frac{avg(\text{Load})}{Load_h}\right) \text{ if } OffBal_h < avg(\text{Load})$$

$$OffBal_h = \left(\frac{Load_h}{avg(\text{Load})} - 1\right) \text{ if } OffBal_h >= avg(Load).$$

Therefore, in the first case (under-loaded part) the local off-balance is negative and in the second case (over-loaded part) the local off-balance is positive. The local off-balance is normalized by calculating its hyperbolic tangent tan h($OffBal_h$), so as to make it range from −1 (under-loaded part) to +1 (over-loaded part). The scaling factor $S_h$ of the part $Part_h$ may then be calculated by:

$$S_h = e^{Ws \cdot \tan h(OffBal_h)}.$$

In this way, when the scaling weight is equal to 0 the scaling factor is always equal to 1 so as to cause no scaling. In all the other cases (i.e., Ws>0) the scaling factor is lower than 1 when the part is under-loaded (down to $S_h=1/e$ for Ws=1) and the scaling factor is higher than 1 when the part is over-loaded (up to $S_h=e$ for Ws=1), so as to reduce and increase, respectively, the distances of each node from the poles of the part. The flow of activity then returns to the block 614 to reiterate the assign phase (with the scaling factor so obtained).

Referring back to the block 632, if the global off-balance is (possibly strictly) lower than the off-balance threshold, the process descends into block 644; the same point is also reached from the block 634 when the correction weight is higher than its value providing the maximum scaling minus the increment pitch (i.e., Ws>1−ε) so that is may not be further incremented. In both cases, a test is made as above to verify whether the least loaded part of the current partition is the same as the one of the previous iteration of the assign phase. If so (and always at the beginning of each iteration of the generation algorithm) the process continues to block 646, wherein the current partition is accepted as a result of the assign phase. The process instead descends into block 648 from the block 636 or from the block 644 when the least loaded part of the current partition is changed with respect to the one of the previous iteration of the assign phase; in both cases, the (previous) partition obtained at the previous iteration of the assign phase is accepted as a result of the assign phase. The flow of activity then merges from either the block 646 or the block 648 into block 650 to complete the assign phase.

At this point, the value is calculated of a (global) objective function to be optimized (for example, minimized) by the generation algorithm; for example, the objective function is defined by the sum or by the maximum of the distances (as adjusted but not scaled) of each node of the network from the closest pole of its part (which distances are already available from the assign phase). One or more convergence conditions of the generation algorithm are verified at block 652. In the solution according to an embodiment of the present disclosure, the convergence conditions are based on a comparison of the value of the objective function at this (current) iteration of the generation algorithm with values thereof at previous iterations of the generation algorithm (saved in a corresponding array); for example, the convergence conditions determine when the value of the objective function is not progressing towards a local minimum, is diverging from the local minimum, is steady at the local minimum or is oscillating around the local minimum. Particularly, the non-progress towards the local minimum may be determined when the value of the objective function at the current iteration of the generation algorithm is higher than the value thereof at a first iteration of the generation algorithm, the divergence from the local minimum may be determined when the value of the objective function increases for a predefined number of consecutive iterations of the generation algorithm (for example, 2-4), the steadiness at the local minimum may be determined when the value of the objective function remains the same for a predefined number of consecutive iterations of the generation algorithm (for example, 2-3), and the oscillation around the local minimum may be determined when the value of the objective function alternatively increases and decreases for a predefined number of consecutive iterations of the generation algorithm (for example, 2-3). This allows ensuring the convergence of the generation algorithm even with the use of multiple poles; indeed, in this case the parts may change continually, so that the convergence condition that is commonly used in the (standard) k-means algorithm (i.e., when the same parts are obtained at two consecutive iterations of the k-means algorithm) might not guarantee its stability. If none of the convergence conditions is satisfied, the process descends from the block 652 into block 654.

At this point, the method implements the move phase of the generation algorithm (for moving the poles of each part to central positions thereof, with decreasing level of accuracy); for this purpose, a loop is performed for each part (starting from a first one in any arbitrary order). Continuing to block 656, a combination number indicating the number of all the possible combinations (without repetition) of the poles of the part $Part_h$ (denoted with $nofComb_h$) is given by the corresponding binomial coefficient:

$$\binom{nofNodes_k}{nofPoles} = \frac{nofNodes_k!}{nofPoles! \cdot (nofNodes_k - nofPoles)!},$$

wherein $nofNodes_h$ is the number of nodes of the part $Part_h$; for example, in the very simple case considered above (nofPoles=2) the combination number is equal to $$\binom{nofNodes_k}{2} = \frac{nofNodes_k!}{2! \cdot (nofNodes_k - 2)!} = \frac{nofNodes_k \cdot (nofNodes_k - 1)}{2}.$$

The combination number is compared at block 658 with a combination threshold defining a maximum values thereof providing an acceptable level of computational complexity (for example, 500-1.000). When the combination number is (possibly strictly) lower than the combination threshold, the enumeration of all the possible combinations of the poles of the part is enabled at block 660 (for example, by asserting an enumeration flag). Otherwise, a sampling of all the possible combinations of the poles of the part is enabled at block 662 (for example, by de-asserting the same enumeration flag); at the same time, a sampling factor (denoted with $SF_h$) is set to a value that reduces the number of possible combinations of the poles of the part (after their sampling accordingly) within the combination threshold (denoted with thComb):

$$SF_h = INT\left(\frac{nofComb_h}{thComb}\right) + 1.$$

The flow of activity merges again at block 664 from either the block 660 or the block 662. At this point, a loop is performed for each (scaled/enumerated) combination of the poles of the part; particularly, at each iteration of the loop a new combination is generated (in any arbitrary order); when the enumeration is enabled (enumeration flag asserted) every generated combination is processed, whereas when the sampling is enabled (enumeration flag de-asserted) only one generated combination is processed among every $SF_h$ generated combinations (skipping the other ones). This allows avoiding a too high computational complexity that might be caused by the factorial grown of the possible combinations of the poles with the number of poles. Moving to block 666, the value is calculated of a (local) objective function to be optimized for the part; for example, the same objective function as above is calculated but for the nodes of the part only (i.e., the sum or the maximum of the distances of each node of the part from the closest pole thereof). The (current) value of the objective function so obtained is compared at block 668 with a (running) minimum value thereof stored in a dedicated variable. If the current value of the objective function is (possibly strictly) lower than the running minimum value (always true for the first combination), the process descends into block 670; in this case, the minimum value is replaced with the current value of the objective function, and an indication of the (current) combination is saved as a (running) best combination in a dedicated variable (replacing any previous content thereof). The process then descends into block 672; the same point is also reached directly from the block 668 when the current value of the objective function is (possibly strictly) higher than the minimum value. A test is now made to verify whether all the combinations have been processed. If not, the flow of activity returns to the block 664 to process a next combination. As soon as all the combinations have been processed, the flow of activity descends from the block 672 into block 674, wherein the best combination so obtained is accepted and the poles of the part are moved to its nodes. A further test is made at block 676 to verify whether all the parts have been processed. If not, the flow of activity returns to the block 654 to process a next part. As soon as all the parts have been processed, the move phase ends by returning to the block 614 to reiterate the assign phase (and possibly the move phase) of the generation algorithm.

Referring back to the block 652, when at least one convergence condition is satisfied, the process descends into block 678, wherein the current partition is taken as a possible result of the generation algorithm. A test is then made at block 680 to verify whether the current partition satisfies one or more approval conditions. For example, the approval conditions determine when none of the parts has disconnected nodes (that may be generated by the use of multiple poles), the global off-balance of the partition is within the off-balance threshold, or the same partition has not been already obtained at a previous iteration of the generation algorithm. If all the approval conditions are satisfied, the partition is accepted at block 682 as a candidate partition for the network (by adding its definition to a dedicated list). The process then descends into block 684; the same point is also reached directly from the block 680 when at least one approval condition is not satisfied (so as to discard the partition).

A test is now made to verify whether the desired number of candidate partitions has been generated. If not, the process returns to the block 606 to reiterate the generation algorithm. Conversely, the generation step ends by descending into block 686.

This block implements the selection step of the partitioning process, wherein one of the candidate partitions is selected as the best partition for the network according to one or more selection criteria. For example, the selection criteria may be based on a cost in terms of the required intercepting valves, on an estimated reduction of the leakages, on a possible return in terms of energy that may be generated by the turbines and/or on a reduction of hydraulic reliability (for example, as described in the above-mentioned document by De Paola et al.). Continuing to block 688, the best partition is configured by defining the position of the intercepting valves (for partitioning the network) and of the regulating valves (or turbines) for regulating the pressure at which each part is supplied and possibly for supplying (inner) parts that are not connected to any source.

The selection step ends by descending into block 690, which implements the optimization step of the partitioning process. In this phase, the setting of the best partition is optimized according to one or more optimization criteria. For example, the regulating valves (or turbines) are set so as to optimize the pressure supplying each part of the best partition (and possibly to maximize the generated energy). The partitioning process then ends at the concentric white/black stop circles 692.

Naturally, in order to satisfy local and specific requirements, a person skilled in the art may apply many logical and/or physical modifications and alterations to the present disclosure. More specifically, although this disclosure has been described with a certain degree of particularity with reference to one or more embodiments thereof, it should be understood that various omissions, substitutions and changes in the form and details as well as other embodiments are possible. Particularly, different embodiments of the present disclosure may even be practiced without the specific details (such as the numerical values) set forth in the preceding description to provide a more thorough understanding thereof; conversely, well-known features may have been omitted or simplified in order not to obscure the description with unnecessary particulars. Moreover, it is expressly intended that specific elements and/or method steps described in connection with any embodiment of the present disclosure may be incorporated in any other embodiment as a matter of general design choice. In any case, ordinal or other qualifiers are merely used as labels to distinguish elements with the same name but do not by themselves connote any priority, precedence or order. Moreover, the terms include, comprise, have, contain and involve (and any forms thereof) should be intended with an open, non-exhaustive meaning (i.e., not limited to the recited items), the terms based on, dependent on, according to, function of (and any forms thereof) should be intended as a non-exclusive relationship (i.e., with possible further variables involved), the term a/an should be intended as one or more items (unless expressly indicated otherwise), and the term means for (or any means-plus-function formulation)

should be intended as any entity or structure suitable for carrying out the relevant function.

For example, an embodiment provides a method for partitioning a network that comprises a plurality of nodes (wherein a distance is defined for each pair of nodes according to a pre-defined metric). The method comprises the following steps. At least one candidate partition of the network (comprising a selected number of parts) is generated. For each candidate partition said step of generating comprises the following operations. A plurality of poles for each part are initialized; each pole is initialized to one of the nodes of the network. The following operations are then repeated. The nodes of the network are assigned each one to the part with the pole having the shortest distance from the node. The poles of each part are moved to distinct nodes of the part according to a local objective function based on the distances of the other nodes of the part from the poles. These operations are repeated until at least one convergence condition is satisfied.

However, the network may be of any type, with any number and type of nodes, and the distance between each pair of nodes may be defined according to any metric (see below). Any number (one or more) of candidate partitions (each one with any number of parts) may be generated. Each part may have any number of multiple poles. The nodes may be assigned to the parts and the poles of each part may be moved in any way (see below). Particularly, the moving of the poles may involve an actual change of position of all the poles of each part or of only some of them, down to a single one (with the other poles of the part that may remain at their previous positions). Moreover, the local objective function may be defined in any way; for example, the local objective function may be based on the distances of each node from any number of poles of the corresponding part (from all of them to only one selected in any way, for example, either the closest one or the most distant one), and it may be based on any function thereof (for example, their average or root mean square). The convergence conditions may be in any number (one or more) and of any type (see below); moreover, they may be verified either after the assignment of the nodes or after the movement of the poles.

In an embodiment, said at least one candidate partition is a plurality of candidate partitions that are generated from different initializations of the poles. The method further comprises selecting one of the candidate partitions according to at least one selection criterion.

However, the selection criteria may be in any number (one or more) and of any type (for example, providing an optimum value of the global objective function). Moreover, the generation of the candidate partitions may be applied to a three-step partitioning process (wherein the selection of the best partition is followed by the optimization of its setting) or to a two-step partitioning process (without any optimization); in any case, the application of the same method simply for generating a single partition is not excluded.

In an embodiment, said step of initializing a plurality of poles for each part comprises selecting a set of initial ones of the nodes of the network in said number of parts, and initializing all the poles of each part to a corresponding one of the initial nodes.

However, the poles may be initialized in any other way (for example, each one to a distinct node); moreover, it is also possible to start by assigning all the nodes of the network to the parts randomly and then to proceed determining their poles.

In an embodiment, said step of assigning the nodes of the network comprises scaling the distance of each node of the network from each pole of the network according to a load of the part of the pole.

However, the distances may be scaled in any way (see below); moreover, the load of each part may be defined in any way (for example, simply according to the number of its nodes). In any case, a generation algorithm that does not support any load balancing mechanism explicitly is not excluded (for example, by simply verifying the off-balance of the candidate partitions after their generation); vice-versa, the same load balancing mechanism may also be implemented without the multiples poles (for example, in the standard k-means algorithm).

In an embodiment, said step of scaling the distance of each node of the network from each pole of the network comprises scaling the distance of each node of the network from each pole of the network to increase the load of a least loaded one of the parts maintaining the least loaded part so.

However, the distances may be scaled to increase the load of the least loaded part in any way (see below). In any case, the possibility of scaling the distances in other ways is not excluded (for example, simply until a desired load balancing level is achieved, or even in a single shot without any feedback verification).

In an embodiment, said step of assigning the nodes of the network comprises repeating the following operations. An assignment of the nodes of the network is determined according to the distance (of each node of the network from each pole of the network) that is scaled according to a scaling factor of the part of the pole. The scaling factor of each part is varied to incrementally increase a correlation of the distances from the poles of the part to the load of the part. These operations are repeated until the least loaded part does not remain so.

However, the scaling factor may be defined in any way, for example, according to any relation (either linear or not) based on the load of the corresponding part (for example, referred to the load of the most loaded part); moreover, the scaling factor may be varied in any way to increase the correlation of the distances from the poles to the load of the corresponding part incrementally (for example, exponentially). In any case, the possibility of determining the desired scaling factor in other ways (for example, with a dichotomic search) is not excluded.

In an embodiment, said step of assigning the nodes of the network comprises conditioning said step of scaling the distances to an indication of a load off-balance of the network reaching an off-balance threshold.

However, the load off-balance of the network may be defined in any way (for example, by the ratio between the load of the least loaded part and the load of the most loaded part) and the off-balance threshold may have any value. In any case, the possibility of always increasing the load of the least loaded part as far as possible (even without any verification of the load off-balance of the network) is not excluded.

In an embodiment, said step of moving the poles of each part comprises calculating the local objective function for each one of at least part of all possible combinations of the distinct nodes of the part, and moving the poles to the distinct nodes of one of the possible combinations optimizing the local objective function.

However, the poles may be moved in any other ways, even without the need of processing all the possible combinations, or a pre-defined part thereof (for example, by calculating the best movement of each pole individually).

In an embodiment, said moving the poles of each part comprises enumerating the possible combinations when a number thereof is within a combination threshold, or sampling the possible combinations according to a sampling factor limiting a number of the sampled possible combinations within the combination threshold otherwise.

However, the combination threshold may have any value; the sampling factor may be defined in any way (even with a pre-defined value independent of the number of the possible combinations and of the combination threshold). Moreover, the possible combinations may be sampled in any way (for example, randomly). In any case, the possibility of always processing all the possible combinations or always a pre-defined number of them is not excluded.

In an embodiment, said at least one convergence condition comprises an indication of a non-progress towards a local optimum, an indication of a divergence from the local optimum, an indication of a steadiness at the local optimum and/or an indication of an oscillation around the local optimum of a global objective function based on the distances of the nodes of each part from the poles of the part.

However, the global objective function may be defined in any way, even differently from the local objective function; for example, as above the global objective function may be based on the distances of each node from any number of poles of the corresponding part (from all of them to only one selected in any way, for example, either the closest one or the most distant one), and it may be based on any function thereof (for example, their average or root mean square). Moreover, the convergence conditions may be defined in any way (for example, according to different observation windows of the global objective function). In any case, different, additional or alternative convergence conditions may be implemented, in any combination (even simply when the partition remains the same for two consecutive iterations).

In an embodiment, the method further comprises the following steps. The distance between each pair of adjacent nodes of the network is defined according to at least one attribute of a connection between the adjacent nodes and/or to at least one attribute of the adjacent nodes. The distance between each pair of non-adjacent nodes of the network is determined according to the distances of the pairs of adjacent nodes along a shortest path between the non-adjacent nodes; the distance between the non-adjacent nodes is adjusted according to at least one attribute of the non-adjacent nodes.

However, the distance between each pair of adjacent nodes may be defined according to any number and type of attributes of their connection only, or the adjacent nodes only or of both of them (for example, length and elevation difference expressed in any way (such as referred to their maximum values), water demand of the nodes, maximum water flow of the pipe); these attributes may contribute to define the distance in any way (for example, with different weights). Moreover, the shortest path between each pair of non-adjacent nodes may be determined in any way (for example, with the Dijkstra algorithm); the distance between the non-adjacent nodes may be adjusted in any way (for example, by an adjusting factor) and according to any dependency (for example, exponentially) on any number and type of attributes of the non-adjacent nodes (either the same as or different from the ones of the adjacent nodes). In any case, a basic implementation without any adjustment of the distances between each pair of non-adjacent nodes is not excluded; vice-versa, the same adjustment of the distances may also be implemented without the multiples poles (for example, in the standard k-means algorithm). More generally, the distances may be defined by any other metric (for example, based on average values).

In an embodiment, the method further comprises discarding each candidate partition having at least one disconnected node being completely surrounded by the nodes of different parts.

However, the verification of this condition may be performed in any way and at any moment (for example, during each assignment of the nodes). In any case, this verification may also be omitted in specific implementations wherein disconnected nodes may be acceptable (for example, in telecommunication networks).

In an embodiment, the network is a water distribution network.

However, the network may be used to distribute any type of water (for example, fresh water) to any kind of nodes (for example, industrial or commercial establishments, fire hydrants). In any case, the same method may also be applied to any other network (for example, gas distribution networks, electrical grids).

Generally, similar considerations apply if the same solution is implemented with an equivalent method (by using similar steps with the same functions of more steps or portions thereof, removing some steps being non-essential, or adding further optional steps); moreover, the steps may be performed in a different order, concurrently or in an interleaved way (at least in part).

A further embodiment provides a computer program, which is configured for causing a computing system to perform the steps of the above-described method. A further embodiment provides a computer program product comprising a non-transitory computer readable medium embodying a computer program, which computer program is loadable into a working memory of a computing system thereby configuring the computing system to perform the same method.

However, the computer program may be implemented as a stand-alone module, as a plug-in for a pre-existing software program (for example, a partitioner that is already available), or even directly in the latter. As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon. Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device. A computer readable signal medium may include a propagated data signal with computer readable program code embodied therein, for example, in base-band or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device. Program code embodied on a computer readable medium may be transmitted using any appropriate medium, including but not limited to wireless, wireline, optical fiber cable, RF, etc., or any suitable combination of the foregoing. Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the relevant computer, as a stand-alone software package, partly on this computer and partly on a remote computer or entirely on the remote computer. In the latter scenario, the remote computer may be connected to the computer through any type of network, including a local area network (LAN) or a wide area network (WAN), or the connection may be made to an external computer (for example, through the Internet using an Internet Service Provider). Aspects of the present invention have been described with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

A further embodiment provides a system comprising means configured for performing the steps of the same method.

However, the method may also be carried out on a system based on a different architecture (for example, a local, wide area, global, cellular or satellite network), and exploiting any type of (wired and/or wireless) connections. It would be readily apparent that it is also possible to deploy the same solution as a service that is accessed through a network (such as in the Internet). Each computing machine may have another structure or may comprise similar elements; moreover, it is possible to replace the computing machine with any code execution entity, either based on a physical machine or a virtual machine (such as a tablet, a mobile phone, and the like), or with a combination of multiple entities (such as a multi-tier architecture, a grid computing infrastructure, and the like).

Generally, similar considerations apply if the system has a different structure or comprises equivalent components, or it has other operative characteristics. In any case, every component thereof may be separated into more elements, or two or more components may be combined together into a single element; moreover, each component may be replicated to support the execution of the corresponding operations in parallel. Moreover, unless specified otherwise, any interaction between different components generally does not need to be continuous, and it may be either direct or indirect through one or more intermediaries.

What is claimed is:

1. A computer-implemented method for partitioning a water distribution network comprising a set of nodes, a distance between each pair of nodes is defined based on a pre-defined metric, the computer-implemented method comprising:

determining, by a computer, at least one candidate partition of the water distribution network that includes a selected number of district metered areas separated hydraulically by valves arranged along a pipe system of the water distribution network, wherein for each candidate partition said determining further comprises:

identifying, by the computer, a plurality of centrally positioned nodes for each district metered area, each centrally positioned node is one of the set of nodes of the water distribution network;

repeating:

assigning, by the computer, the set of nodes of the water distribution network, each node is assigned to a particular district metered area with a centrally positioned node having a shortest distance from that particular node, and moving, by the computer, the plurality of centrally positioned nodes of each respective district metered area to distinct nodes of the particular district metered area according to a local objective function corresponding to the particular district metered area based on distances of other nodes of the particular district metered area from the plurality of centrally positioned nodes, until at least one convergence condition is satisfied, wherein said at least one convergence condition is at least one of an indication of a non-progress towards a local optimum, an indication of a divergence from the local optimum, an indication of a steadiness at the local optimum, and an indication of an oscillation around the local optimum of a global objective function corresponding to said at least one candidate partition based on distances of nodes of each respective district metered area from the plurality of centrally positioned nodes of the particular district metered area, wherein said at least one candidate partition is a plurality of candidate partitions determined from different identifications of centrally positioned nodes;

selecting, by the computer, a candidate partition of the plurality of candidate partitions of the water distribution network according to at least one selection criterion; and configuring, by the computer, the selected candidate partition of the water distribution network to decrease water pressure in each district metered area corresponding to the selected candidate partition, which decreases water pumping energy and decreases water leakage.

2. The computer-implemented method according to claim 1, wherein said identifying, by the computer, the plurality of centrally positioned nodes for each district metered area further comprises:

selecting, by the computer, a set of initial nodes of the set of nodes of the water distribution network in said selected number of district metered areas; and identifying, by the computer, all centrally positioned nodes of each particular district metered area to a corresponding one of the set of initial nodes.

3. The computer-implemented method according to claim 1, wherein said assigning, by the computer, the set of nodes of the water distribution network further comprises:

scaling, by the computer, a distance of each node of the water distribution network from each centrally positioned node of each respective district metered area of the water distribution network according to a load of a particular district metered area corresponding to a respective centrally positioned node.

4. The computer-implemented method according to claim 3, wherein said scaling, by the computer, the distance of each node of the water distribution network from each centrally positioned node of each respective district metered area of the water distribution network further comprises:

scaling, by the computer, the distance of each node of the water distribution network from each centrally positioned node of each respective district metered area of the water distribution network to increase the load of a least loaded one of the selected number of district metered areas while maintaining the least loaded district metered area as least loaded.

5. The computer-implemented method according to claim 4, wherein said assigning, by the computer, the set of nodes of the water distribution network further comprises repeating:

determining, by the computer, an assignment of the set of nodes of the water distribution network according to the distance of each node of the water distribution network from each centrally positioned node of each respective district metered area of the water distribution network being scaled according to a scaling factor of a particular district metered area corresponding to a respective centrally positioned node, and varying, by the computer, the scaling factor of each respective district metered area to incrementally increase a correlation of the distances from the centrally positioned nodes of the particular district metered area to the load of the particular district metered area, until the least loaded part does not remain least loaded.

6. The computer-implemented method according to claim 3, wherein said assigning, by the computer, the set of nodes of the water distribution network further comprises:

conditioning, by the computer, said scaling of the distances to an indication of a load off-balance of the water distribution network reaching an off-balance threshold.

7. The computer-implemented method according to claim 1, wherein said moving, by the computer, the plurality of centrally positioned nodes of each respective district metered area further comprises:

calculating, by the computer, the local objective function for each one of at least part of all possible combinations of the distinct nodes of the particular district metered area; and moving, by the computer, the plurality of centrally positioned nodes to the distinct nodes of one of said all possible combinations optimizing the local objective function.

8. The computer-implemented method according to claim 7, wherein said moving, by the computer, the plurality of centrally positioned nodes of each respective district metered area further comprises:

enumerating, by the computer, said all possible combinations when a number thereof is within a combination threshold; or sampling, by the computer, said all possible combinations according to a sampling factor limiting a number of sampled possible combinations within the combination threshold otherwise.

9. The computer-implemented method according to claim 1, further comprising:

defining, by the computer, the distance between each pair of adjacent nodes of the water distribution network according to at least one of: at least one attribute of a connection between the adjacent nodes and at least one attribute of the adjacent nodes; and determining, by the computer, the distance between each pair of non-adjacent nodes of the water distribution network according to distances between pairs of adjacent nodes along a shortest path between the non-adjacent nodes, wherein the distance between the non-adjacent nodes is adjusted according to at least one attribute of the non-adjacent nodes.

10. The computer-implemented method according to claim 1, further comprising:

discarding, by the computer, each candidate partition having at least one disconnected node being completely surrounded by nodes of different district metered areas.

11. A computer program product comprising a non-transitory computer readable medium embodying a computer program configured to cause a computer system to perform the computer-implemented method according to claim 1 when the computer program is executed on the computer system.

12. A computer system comprising a data processor coupled to a memory having program code stored therein that is operable to perform, when executed by the data processor, the computer-implemented method according to claim 1.

* * * * *